(12) United States Patent
Azadet

(10) Patent No.: US 9,225,501 B2
(45) Date of Patent: Dec. 29, 2015

(54) NON-LINEAR MODELING OF A PHYSICAL SYSTEM USING LOOK-UP TABLE WITH POLYNOMIAL INTERPOLATION

(71) Applicant: Intel Corporation, Santa Clara, CA (US)

(72) Inventor: Kameran Azadet, Pasadena, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/230,622

(22) Filed: Mar. 31, 2014

(65) Prior Publication Data

US 2014/0314181 A1 Oct. 23, 2014

Related U.S. Application Data

(60) Provisional application No. 61/812,858, filed on Apr. 17, 2013.

(51) Int. Cl.

| | |
|---|---|
| *H04L 25/03* | (2006.01) |
| *H04L 5/14* | (2006.01) |
| *H04L 25/08* | (2006.01) |
| *G06F 17/50* | (2006.01) |
| *H04B 1/62* | (2006.01) |
| *H04L 1/00* | (2006.01) |
| *H04B 1/04* | (2006.01) |
| *G06F 17/15* | (2006.01) |
| *H04L 27/36* | (2006.01) |
| *H04J 11/00* | (2006.01) |
| *H04B 1/525* | (2015.01) |

(52) U.S. Cl.
CPC .............. *H04L 5/1461* (2013.01); *G06F 17/15* (2013.01); *G06F 17/50* (2013.01); *G06F 17/5009* (2013.01); *H04B 1/0475* (2013.01); *H04B 1/525* (2013.01); *H04B 1/62* (2013.01); *H04J 11/004* (2013.01); *H04L 1/0043* (2013.01); *H04L 25/03012* (2013.01); *H04L 25/03343* (2013.01); *H04L 25/08* (2013.01); *H04L 27/367* (2013.01); *H04L 27/368* (2013.01); *H04B 2001/0425* (2013.01)

(58) Field of Classification Search
None
See application file for complete search history.

(56) References Cited

U.S. PATENT DOCUMENTS

| | | | | |
|---|---|---|---|---|
| 6,587,514 | B1 * | 7/2003 | Wright et al. | 375/296 |
| 6,798,843 | B1 * | 9/2004 | Wright et al. | 375/296 |
| 7,924,942 | B2 * | 4/2011 | Rexberg | 375/297 |
| 2001/0050592 | A1 * | 12/2001 | Wright et al. | 330/2 |
| 2004/0248516 | A1 * | 12/2004 | Demir et al. | 455/63.1 |
| 2008/0030388 | A1 * | 2/2008 | Muck et al. | 341/138 |

(Continued)

*Primary Examiner* — Daniel Washburn
*Assistant Examiner* — Berhanu Tadese
(74) *Attorney, Agent, or Firm* — Schwegman Lundberg & Woessner, P.A.

(57) ABSTRACT

Methods and apparatus are provided for non-linear modeling of a physical system using look-up tables with polynomial interpolation. A non-linear function is evaluated for a complex input value by obtaining at least one look-up table with polynomial interpolation that represents the non-linear function, wherein entries in the look-up table comprise polynomial coefficients of at least degree two for different segments of the non-linear function; obtaining a point from the look-up table that is near a magnitude of the complex input value; and generating a complex output value by evaluating the polynomial coefficients at the point to perform a Taylor Series expansion from said point. The non-linear function characterizes, for example, a power amplifier or an inverse of a power amplifier and the look-up tables can be used, for example, to implement digital pre-distortion.

20 Claims, 3 Drawing Sheets

(56) References Cited

U.S. PATENT DOCUMENTS

| | | | |
|---|---|---|---|
| 2008/0123770 A1* | 5/2008 | Copeland | 375/285 |
| 2008/0144539 A1* | 6/2008 | Sperlich et al. | 370/278 |
| 2009/0256632 A1* | 10/2009 | Klingberg et al. | 330/149 |
| 2010/0138463 A1* | 6/2010 | Azadet et al. | 708/290 |
| 2010/0138464 A1* | 6/2010 | Azadet et al. | 708/290 |
| 2010/0138465 A1* | 6/2010 | Azadet et al. | 708/290 |
| 2010/0138468 A1* | 6/2010 | Azadet et al. | 708/511 |
| 2014/0086361 A1* | 3/2014 | Azadet et al. | 375/297 |

* cited by examiner

300

350

US 9,225,501 B2

NON-LINEAR MODELING OF A PHYSICAL SYSTEM USING LOOK-UP TABLE WITH POLYNOMIAL INTERPOLATION

CROSS-REFERENCE TO RELATED APPLICATIONS

The present application claims priority to U.S. Patent Provisional Application Ser. No. 61/812,858, filed Apr. 17, 2013, entitled "Digital Front End (DFE) Signal Processing," incorporated by reference herein.

The present application is related to U.S. patent application Ser. No. 14/168,621, filed Jan. 30, 2014, entitled "Non-Linear Modeling of a Physical System Using Direct Optimization of Look-Up Table Values;" PCT Patent Application No. PCT/US12/62179, filed Oct. 26, 2012, entitled "Software Digital Front End (SoftDFE) Signal Processing;" and PCT Patent Application No. PCT/US12/62186, filed Oct. 26, 2012, entitled "Processor Having Instruction Set with User-Defined Non-Linear Functions for Digital Pre-Distortion (DPD) and Other Non-Linear Applications," each incorporated by reference herein.

FIELD OF THE INVENTION

The present invention is related to digital signal processing techniques and, more particularly, to techniques for modeling of non-linear systems.

BACKGROUND OF THE INVENTION

Digital pre-distortion (DPD) is a technique used to linearize a power amplifier in a transmitter to improve the efficiency of the power amplifier. A digital pre-distortion circuit inversely models the gain and phase characteristics of the power amplifier and, when combined with the amplifier, produces an overall system that is more linear and reduces distortion than would otherwise be caused by the power amplifier. An inverse distortion is introduced into the input of the amplifier, thereby reducing any non-linearity that the amplifier might otherwise exhibit.

PCT Patent Application No. PCT/US12/62186, filed Oct. 26, 2012, entitled "Processor Having Instruction Set with User-Defined Non-Linear Functions for Digital Pre-Distortion (DPD) and Other Non-Linear Applications," discloses non-linear functions that include one or more parameters specified by a user, such as filter coefficient values or values from a look-up table. The disclosed DPD techniques are based on a generalized memory polynomial (GMP) model and implemented using look-up tables. Polynomial models, however, do not provide adequate performance for a number of common situations. For example, polynomial models do not capture functions that have discontinuities in them (such as a discontinuity of amplitude or derivative, or a higher order derivative).

U.S. patent application Ser. No. 14/168,621, filed Jan. 30, 2014, entitled "Non-Linear Modeling of a Physical System Using Direct Optimization of Look-Up Table Values," provides improved techniques for non-linear modeling of a physical system, such as a DPD system or a power amplifier, using direct optimization of look-up table values.

Nonetheless, a need remains for improved techniques for modeling non-linear systems using look-up tables with polynomial interpolation.

SUMMARY OF THE INVENTION

Generally, improved techniques are provided for non-linear modeling of a physical system using look-up tables with polynomial interpolation. According to one aspect of the invention, a non-linear function is evaluated for a complex input value by obtaining at least one look-up table with polynomial interpolation that represents the non-linear function, wherein entries in the look-up table comprise polynomial coefficients of at least degree two for different segments of the non-linear function; obtaining a point from the look-up table that is near a magnitude of the complex input value; and generating a complex output value by evaluating the polynomial coefficients at the point to perform a Taylor Series expansion from said point. The non-linear function characterizes, for example, a power amplifier or an inverse of a power amplifier. The two-dimensional look-up tables can be used, for example, to implement digital pre-distortion.

According to another aspect of the invention, values in the look-up table are obtained using a direct optimization technique that obtains physical data for the non-linear function by applying a set of complex input samples x(n) to the non-linear function and measuring a complex output y(n) of the non-linear function; and directly computes parameters $\Phi$ of a memory model for the non-linear function from the physical data, wherein the memory model comprises one or more look-up tables having polynomial interpolation and wherein the parameters $\Phi$ produce a substantially minimum mean square error, wherein the parameters $\Phi$ are provided for storage as entries in the one or more look-up tables.

According to yet another aspect of the invention, the look-up tables with polynomial interpolation are used in a processor instruction as part of an instruction set of one or more of a scalar processor and a vector processor. The look-up table can be stored in a memory of a digital processor, and the polynomial interpolation is performed as part of a user-defined non-linear instruction that takes a complex number as an input, x, and computes $f(x)$.

A more complete understanding of the present invention, as well as further features and advantages of the present invention, will be obtained by reference to the following detailed description and drawings.

DETAILED DESCRIPTION

Aspects of the present invention provide improved techniques for modeling non-linear systems, such as a DPD system or a power amplifier. According to one aspect of the invention, a physical system, such as a DPD system, is modeled using a non-linear model with look-up table values having polynomial interpolation. In one exemplary embodiment, the complex input and complex output data of a physical system are used to directly determine the polynomial values that are stored in the exemplary look-up tables that implement the non-linear model. The model comprises one or more look-up tables having polynomial interpolation.

Existing DPD techniques are typically based on a generalized memory polynomial (GMP) model and are implemented using look-up tables. GMP itself models an ideal Volterra series. GMP models an actual physical system such as a reverse power amplifier response (i.e., output to input response). The look-up tables are obtained by first computing the coefficients of each of the GMP polynomials using conventional techniques (e.g., a least squares approach) and then sampling each of the polynomials to create the look-up tables for each polynomial. This can be considered modeling a model, or approximating an approximation. The look-up tables approximate the GMP polynomial model, which is itself an approximation of an ideal infinite tap Volterra-based pre-distorter.

Aspects of the present invention recognize that polynomial models do not work well over an extended interval of input signal and do not work well in the presence of a discontinuity (e.g., a derivative discontinuity). In addition, aspects of the present invention recognize that look-up tables will perform better in these cases.

With conventional one dimensional look-up tables, two values neighboring a desired value, x, are typically obtained from the look-up table, and then the result is obtained by performing a linear interpolation between the two obtained values.

Thus, aspects of the present invention provide a non-linear model with look-up tables having polynomial interpolation. In one exemplary embodiment, the polynomial values for the look-up tables are directly optimized from physical data. The look-up table is defined as segments of polynomials defined by the coefficients of the polynomials stored in the look-up table for each segment. The output is computed by evaluating the polynomial for the look-up table point that is closest to the desired value, x.

According to a further aspect of the invention, in order to improve continuity of the output results between segments, linear interpolation is optionally performed between segments. For a given input, x, the two points in the look-up table that are closest to the given input, x, are obtained and the polynomial value corresponding to the two points are computed to form two intermediate values. Linear interpolation is then performed between these two intermediate values to obtain the final output.

Figure 1:
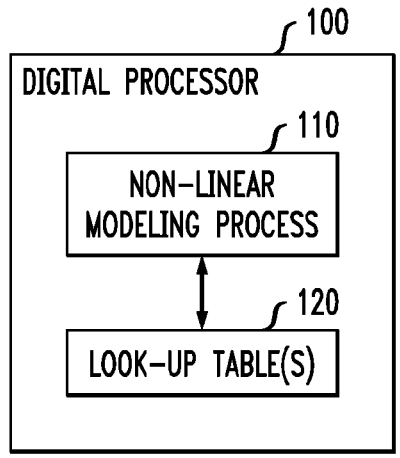
FIG. 1 is a schematic block diagram of an exemplary digital processor that incorporates features of the present invention.

FIG. 1 is a schematic block diagram of an exemplary digital processor 100 that incorporates features of the present invention. The exemplary digital processor 100 can be implemented as a DSP or a vector processor. As shown in FIG. 1, the exemplary digital processor 100 includes a non-linear modeling process 110, as discussed further below in conjunction with FIG. 2, for optimizing physical data, for example, using a mean-square error approach, to determine the values to be stored in one or more exemplary look-up tables 120 that implement the non-linear model. The exemplary look-up tables 120 are in the memory of the digital processor 100.

The disclosed digital processors 100 may have a scalar architecture that processes a single complex number at a time, or a vector architecture that processes one or more complex numbers simultaneously. In the case of a vector-based digital processor implementation, the input complex number is a vector comprised of a plurality of scalar complex numbers that are processed in parallel.

A vector-based digital signal processor 100 may contain plural functional units for performing the functions described herein. For example, a dual digital signal processor 100 contains two functional units that are capable of performing two independent non-linear function operations concurrently.

Generally, aspects of the present invention extend conventional digital signal processors to provide an enhanced instruction set that supports non-linear functions using one or more look-up tables. The digital signal processor 100 in accordance with the present invention receives at least one number as an input, applies a function to the input and generates an output value.

Figure 2:
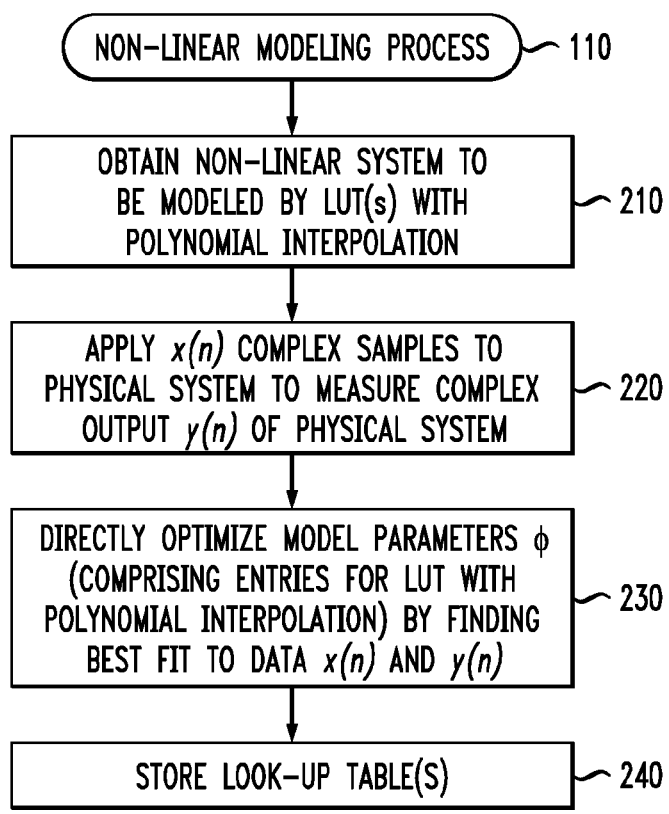
FIG. 2 is a flow chart illustrating an exemplary implementation of the non-linear modeling process of FIG. 1 incorporating aspects of the present invention.

FIG. 2 is a flow chart illustrating an exemplary implementation of the non-linear modeling process 110 of FIG. 1 incorporating aspects of the present invention. As shown in FIG. 2, the exemplary non-linear modeling process 110 initially obtains the non-linear system (real) to be modeled in accordance aspects of the invention during step 210. The model comprises a look-up table with polynomial interpolation. The non-linear system is defined by an unknown non-linear function $f(x)$, similar to the functions described in PCT Patent Application No. PCT/US12/62186, filed Oct. 26, 2012, entitled "Processor Having Instruction Set with User-Defined Non-Linear Functions for Digital Pre-Distortion (DPD) and Other Non-Linear Applications:"

$$f(x)=y.$$

The function $f(x)$ is thus an unknown function defining the response of the actual physical system to be modeled, such as a reverse power amplifier response. Aspects of the present invention model the response $f(x)$ of the actual physical system using a model $\hat{f}(x)$ and estimate the parameters (polynomial LUT entries) of this model $\hat{f}(x)$ by performing direct optimization using the physical data.

As discussed hereinafter, the parameters (polynomial LUT entries) of the model $\hat{f}(x)$ are obtained using measured data $x(n)$ and $y(n)$. For example, to model the response of a power amplifier, $x(n)$ is used as the complex input of the power amplifier and $y(n)$ is used as the complex output of the power amplifier. Likewise, to model the inverse response of the power amplifier, a conceptual non-linear system or black box is used that has as its complex input the power amplifier output and as its complex output the power amplifier input.

Thus, the non-linear modeling process 110 applies the complex input samples $x(n)$ to the physical system to measure a set of N complex output samples $y(n)$ ($n=0$ to $N-1$) during step 220 to obtain the physical data for the system:

$$f(x_n)=y_n$$

The non-linear modeling process 110 then directly optimizes the parameters $\Phi$ for the model during step 230 to find the best fit for the measured physical data. Generally, as discussed further below, the best fit identifies the parameters that provide a substantially minimum value for an exemplary mean square error using a least squares algorithm. In further variations, alternative algorithms can use, for example, recursive least squares (RLS) or least mean square (LMS) that achieve various trade-offs between complexity and conversion speed.

As discussed further below, the model parameters comprise the polynomial entries for the LUT(s), referred to as $\hat{f}(x)$ of $f(x)$. The LUTs are then stored during step 240.

Segmented Polynomial Static Non-Linear Model

The goal is to identify a static non-linear function (real) $f(x)=y$ with a segmented polynomial look-up table.

As indicated above, a set of N samples $n=0$ to $N-1$ are measured:

$$f(x_n)=y_n$$

This optimization is used to find the segmented polynomial approximation $\hat{f}(x)$ of $f(x)$.

Figure 3A:
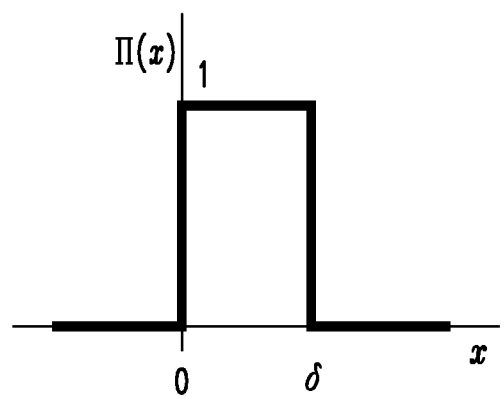
FIG. 3A illustrates a rectangular basis function.

The segmented (or piecewise) polynomial approximation of the function $f$ can be written as:

$$\hat{f}(x) = \sum_{p=0}^{P-1}\sum_{k=0}^{K-1} \varphi_{p,k}(x-p\delta)^k \prod(x-p\delta)$$

where the rectangular basis function Π 300 (shown in FIG. 3A) is equal to one for $0<x<\delta$, and is equal to 0 otherwise. As shown in FIG. 3A, the rectangular function Π(x) is a rectangular window that forms the basis for the LUT-based decomposition. It is noted that the coefficients $\phi_{p,k}$ are the desired unknowns. It is further noted that $\hat{f}(x)$ is a linear function of $(\phi_{p,k})$.

Figure 3B:
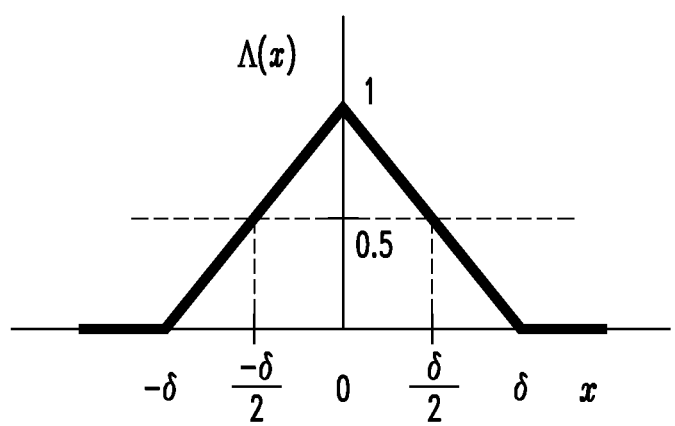
FIG. 3B illustrates a triangular basis function.

Alternatively, the segmented polynomial could use a triangular basis function Λ(x) 350, as shown in FIG. 3B, that would allow a linear interpolation between segments with better continuity between segments:

$$\hat{f}(x) = \sum_{p=0}^{P-1}\sum_{k=0}^{K-1} \varphi_{p,k}(x-p\delta)^k \Lambda(x-p\delta)$$

where the triangular basis function Λ(x) 350 (shown in FIG. 3A) is equal to $$1 - \frac{|x|}{\delta}$$

for values of x that are less than δ, and equal to 0 for values of x that are greater than δ.

Consider a DPD (using a static model) with direct optimization of LUT with polynomial interpolation and linear interpolation between segments, as discussed above. Let the model have P element look-up tables, and order K polynomial interpolation. Let x(n) be the complex input to the non-linear system, y(n) complex output, and ŷ(n) be the output of the model (to be estimated).

$$\hat{y}(n) = x(n) \cdot \sum_{p=0}^{P-1}\sum_{k=0}^{K-1} \varphi_{p,k}(|x(n)|-p\delta)^k \Lambda(|x(n)|-p\delta)$$

The approximation error can be written as:

$$e_n = \hat{y}_n - y_n$$

The cost function to be minimized can be expressed as follows:

$$C = \sum_{n=0}^{N-1} |e_n|^2$$

Let U be the N×J (where J=P×K) matrix, where column elements are the $$x(n)(|x(n)|-p\delta)^k \Lambda(|x(n)|-p\delta)$$

i.e., $u(\text{index},n) = x(n)(|x(n)|-p\delta)^k \Lambda(|x(n)|-p\delta)$, where index=pK+k The solution is given by a standard Least Square solution:

$$\Phi = (U^H U)^{-1} \cdot U^H Y$$

Generalized Memory Polynomial (GMP) Model Using Segmented Polynomials

The DPD model used for this analysis is based on the generalized memory polynomials (GMP). The GMP model is a simplified form of the more general but complex Volterra Series.

The GMP NL filter operation is described by the following equation (where x(n) is the input to DPD and y(n) is the output of DPD non-linear filter):

$$y(n) = \sum_{m=0}^{M-1}\sum_{l=0}^{M-1}\sum_{k=0}^{K-1} h_{k,m,l}|x(n-l)|^k x(n-m)$$

This equation can be re-written as:

$$y(n) = \sum_{m=0}^{M-1}\sum_{l=0}^{M-1} x(n-m) \sum_{k=0}^{K-1} h_{k,m,l}|x(n-l)|^k$$

In this mathematically equivalent form, polynomial terms appear:

$$f_{m,l}(|x(n-1)|) = \sum_{k=0}^{K-1} h_{k,m,l}|x(n-l)|^k$$

Finally, the input-output relationship of the DPD is expressed as:

$$y(n) = \sum_{m=0}^{M-1}\sum_{l=0}^{M-1} x(n-m) \cdot f_{m,l}(|x(n-l)|)$$

The $f_{m,l}(.)$ term can be approximated with segmented polynomials defined by a LUT, as follows $$\hat{f_{m,l}}(|x|) = \sum_{p=0}^{P-1}\sum_{k=0}^{K-1} \varphi_{m,l,p,k}(|x|-p\delta)^k \Pi(|x|-p\delta)$$

The GMP model can be written as:

$$\hat{y}(n) =$$
$$\sum_{m=0}^{M-1}\sum_{l=0}^{M-1}\left(x(n-m) \cdot \sum_{p=0}^{P-1}\sum_{k=0}^{K-1} \varphi_{m,l,p,k}(|x(n-l)|-p\delta)^k \prod(|x(n-l)|-p\delta)\right)$$

The approximation error can be written as:

$$e_n = \hat{y}_n - y_n$$

The cost function to be minimized can be expressed as follows:

$$C = \sum_{n=0}^{N-1} |e_n|^2$$

Let U be the N×J (where J=M×M×P×K) matrix, where column elements are expressed as follows:

$$x(n-m)(|x(n-l)|-p\delta)^k \Pi(|x(n-l)|-p\delta).$$

The solution is given by a standard Least Square solution:

$$\Phi=(U^H U)^{-1} \cdot U^H Y$$

It is again noted that an aspect of the invention improves continuity between points using linear interpolation between segments. For derivations, replace the rectangular basis function Π with the triangular basis function Λ in the above equations, as would be apparent to a person of ordinary skill in the art.

Figure 4:
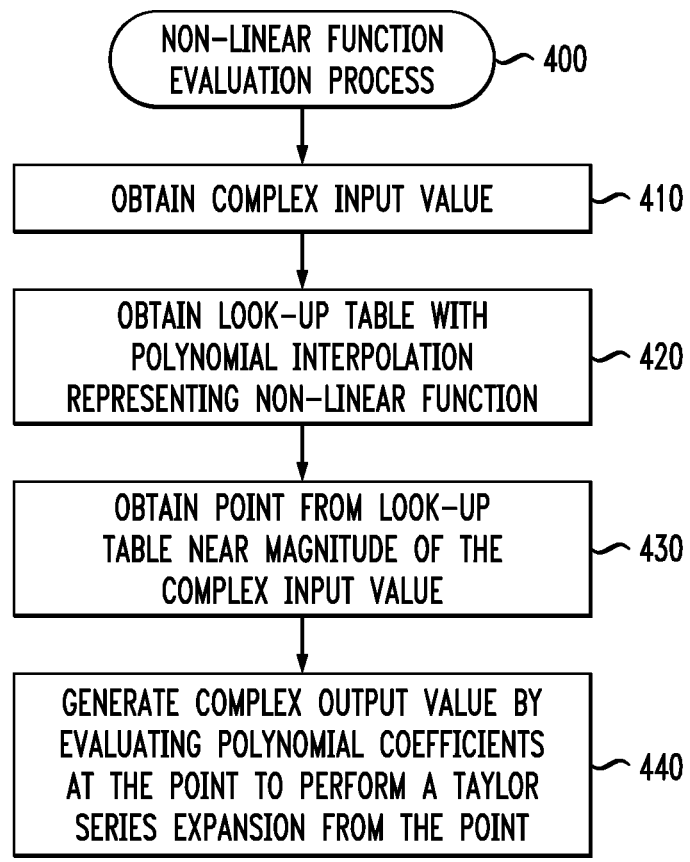
FIG. 4 is a flow chart describing an exemplary implementation of a non-linear function evaluation process incorporating aspects of the present invention.

FIG. 4 is a flow chart describing an exemplary implementation of a non-linear function evaluation process 400 incorporating aspects of the present invention. As shown in FIG. 4, a complex input value is obtained during step 410. At least one look-up table with polynomial interpolation that represents the non-linear function is obtained during step 420. Entries in the look-up table comprise polynomial coefficients of at least degree two for different segments of the non-linear function. A point is obtained from the look-up table during step 430 that is near a magnitude of the complex input value. Finally, a complex output value is generated during step 440 by evaluating the polynomial coefficients at the point to perform a Taylor Series expansion from said point.

CONCLUSION

While exemplary embodiments of the present invention have been described with respect to digital logic blocks and memory tables within a digital processor, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

I claim:

1. A digital pre-distortion (DPD) system, comprising:
a digital signal processor configured to evaluate a non-linear function for a complex input value, comprising:
a memory configured to store at least one look-up table with polynomial interpolation that represents said non-linear function, wherein entries in said look-up table comprise polynomial coefficients of at least degree two for different segments of said non-linear function, said polynomial coefficients configured to provide at least one of a rectangular or triangular basis function for each segment of said non-linear function;
at least one processor, coupled to the memory, operative to:
obtain a point from said look-tip table that is near a magnitude of said complex input value; and
generate a complex output value by evaluating said polynomial coefficients at said point to perform a Taylor Series expansion from said point.

2. A digital pre-distortion (DPD) system, comprising:
a digital signal processor configured to evaluate a non-linear function for a complex input value, comprising:
a memory configured to store at least one look-up table with polynomial interpolation that represents said non-linear function, wherein entries in said look-up table comprise polynomial coefficients of at least degree two for different segments of said non-linear function;
at least one processor, coupled to the memory, operative to:
obtain a point from said look-tip table that is near a magnitude of said complex input value; and
generate a complex output value by evaluating said polynomial coefficients at said point to perform a Taylor Series expansion from said point,
wherein values in said look-up table are configured to be obtained using a direct optimization technique that obtains physical data for said non-linear function by applying a set of complex input samples x(n) to said non-linear function and measuring a complex output y(n) of said non-linear function and directly computes parameters φ of a memory model for said non-linear function from said physical data, said memory model comprises one or more look-up tables having polynomial interpolation, and said parameters φ produce a substantially minimum mean square error, said parameters φ are provided for storage as entries in said one or more look-up tables.

3. The method of claim 1, wherein said step of obtaining a point from said look-up table that is near said magnitude of said complex input value comprises obtaining two points that are near said magnitude of said complex input value and wherein said method further comprises the steps of evaluating said polynomial coefficients for said two points to perform a Taylor Series expansion from each point to form two intermediate values and linearly interpolating between said two intermediate values to generate said complex output value.

4. The method of claim 1, wherein said non-linear function characterizes one or more of a power amplifier and an inverse of a power amplifier.

5. The method of claim 1, wherein said one or more look-up tables are used to implement digital pre-distortion.

6. The method of claim 1, wherein said one or more look-up tables with polynomial interpolation are used in a processor instruction as part of an instruction set of one or more of a scalar processor and a vector processor.

7. The method of claim 6, wherein said look-up table is stored in a memory of said one or more of a scalar processor and a vector processor, and the polynomial interpolation is performed as part of a user-defined non-linear instruction that takes a complex number as an input, x, and computes $f(x)$.

8. The method of claim 7, wherein said vector processor applies a complex input vector $[x_1, x_2, \ldots, x_N]$ to a plurality of non-linear functions $f_1, f_2, \ldots f_N$ to compute a complex vector output, $f_1(x_1), f_2(x_2) \ldots f_N(x_N)$.

9. The method of claim 1, wherein values in said look-up tables are obtained using one or more of a least squares algorithm, recursive least squares (RLS) and least mean square (LMS).

10. The method of claim 1, wherein said point that is near said magnitude of said complex input value comprises said point that is closest to said magnitude of said complex input value.

11. A power amplifier, comprising:
a digital signal processor that evaluates a non-linear function for a complex input value, comprising:
a memory configured to store storing at least one look-up table with polynomial interpolation that represents said non-linear function, wherein entries in said look-up table comprise polynomial coefficients of at least degree two for different segments of said non-linear function, said polynomial coefficients configured to provide at least one of a rectangular or triangular basis function for each segment of said non-linear function; and
at least one processor, coupled to the memory, operative to:
obtain a point from said look-tip table that is near a magnitude of said complex input value; and
generate a complex output value by evaluating said polynomial coefficients at said point to perform a Taylor Series expansion from said point.

12. A power amplifier, comprising:
a digital signal processor that evaluates a non-linear function for a complex input value, comprising:
a memory configured to store at least one look-up table with polynomial interpolation that represents said non-linear function, wherein entries in said look-up table comprise polynomial coefficients of at least degree two for different segments of said non-linear function; and
at least one processor, coupled to the memory, operative to:
obtain a point from said look-tip table that is near a magnitude of said complex input value; and
generate a complex output-value by evaluating said polynomial coefficients at said point to perform a Taylor Series expansion from said point,
wherein values in said look-up table are configured to be obtained using a direct optimization technique that obtains physical data for said non-linear function by applying a set of complex input samples $x(n)$ to said non-linear function and measuring a complex output $y(n)$ of said non-linear function and directly computes parameters $\phi$ of a memory model for said non-linear function from said physical data, said memory model comprises one or more look-up tables having polynomial interpolation, and said parameters $\phi$ produce a substantially minimum mean square error, said parameters $\phi$ are provided for storage as entries in said one or more look-up tables.

13. The digital signal processor of claim 11, wherein said step of obtaining a point from said look-up table that is near said magnitude of said complex input value comprises obtaining two points that are near said magnitude of said complex input value and wherein said digital signal processor further comprises the steps of evaluating said polynomial coefficients for said two points to perform a Taylor Series expansion from each point to form two intermediate values and linearly interpolating between said two intermediate values to generate said complex output value.

14. The digital signal processor of claim 11, wherein said non-linear function characterizes one or more of a power amplifier and an inverse of a power amplifier.

15. The digital signal processor of claim 11, wherein said one or more look-up tables are used to implement digital pre-distortion.

16. The digital signal processor of claim 11, wherein said one or more look-up tables with polynomial interpolation are used in a processor instruction as part of an instruction set of one or more of a scalar processor and a vector processor.

17. The digital signal processor of claim 11, wherein said digital signal processor is one or more of a scalar processor and a vector processor, and wherein the polynomial interpolation is performed as part of a user-defined non-linear instruction that takes a complex number as an input, x, and computes $f(x)$.

18. The digital signal processor of claim 17, wherein said vector processor applies a complex input vector $[x_1, x_2, \ldots, x_N]$ to a plurality of non-linear functions $f_1, f_2, \ldots f_N$ to compute a complex vector output, $f_1(x_1), f_2(x_2) \ldots f_N(x_N)$.

19. The digital signal processor of claim 11, wherein values in said look-up tables are obtained using one or more of a least squares algorithm, recursive least squares (RLS) and least mean square (LMS).

20. The digital signal processor of claim 11, wherein said point that is near said magnitude of said complex input value comprises said point that is closest to said magnitude of said complex input value.

* * * * *

UNITED STATES PATENT AND TRADEMARK OFFICE
CERTIFICATE OF CORRECTION

PATENT NO.       : 9,225,501 B2
APPLICATION NO.  : 14/230622
DATED            : December 29, 2015
INVENTOR(S)      : Kameran Azadet It is certified that error appears in the above-identified patent and that said Letters Patent is hereby corrected as shown below:

On the Title page, in item (57), in "Abstract", in column 2, line 1-15, delete "Methods and apparatus are provided for non-linear modeling of a physical system using look-up tables with polynomial interpolation. A non-linear function is evaluated for a complex input value by obtaining at least one look-up table with polynomial interpolation that represents the non-linear function, wherein entries in the look-up table comprise polynomial coefficients of at least degree two for different segments of the non-linear function; obtaining a point from the look-up table that is near a magnitude of the complex input value; and generating a complex output value by evaluating the polynomial coefficients at the point to perform a Taylor Series expansion from said point. The non-linear function characterizes, for example, a power amplifier or an inverse of a power amplifier and the look-up tables can be used, for example, to implement digital pre-distortion." and insert --Methods and apparatus are provided for non-linear modeling of a physical system using look-up tables with polynomial interpolation. A non-linear function is evaluated for a complex input value by obtaining at least one look-up table with polynomial interpolation that represents the function. Table entries comprise polynomial coefficients of at least degree two for different function segments. A point from the table is obtained near a magnitude of the complex input value. A complex output value is generated by evaluating the coefficients at the point to perform a Taylor Series expansion from the point. The function characterizes a power amplifier or an inverse thereof and the tables can be used to implement digital pre-distortion. The table can be stored in a digital processor memory, and the interpolation can be performed as part of a user-defined non-linear instruction that takes a complex number as an input, x, and computes f(x).--, therefor In column 7-8, in Claim 1, delete "1. A digital pre-distortion (DPD) system, comprising:
a digital signal processor configured to evaluate a non-linear function for a complex input value, comprising:
a memory configured to store at least one look-up table with polynomial interpolation that represents said non-linear function, wherein entries in said look-up table comprise polynomial coefficients of at least degree two for different segments of said non-linear function, said polynomial coefficients configured to provide at least one of a rectangular or triangular basis function for each segment of said non-linear function;

Signed and Sealed this
Sixteenth Day of August, 2016

Michelle K. Lee
*Director of the United States Patent and Trademark Office* at least one processor, coupled to the memory, operative to:
obtain a point from said look-tip table that is near a magnitude of said complex input value; and
generate a complex output value by evaluating said polynomial coefficients at said point to perform a Taylor Series expansion from said point." and insert --1. A digital pre-distortion (DPD) system, comprising:
a digital signal processor configured to evaluate a non-linear function for a complex input value, comprising:
a memory configured to store at least one look-up table with polynomial interpolation that represents said non-linear function, wherein entries in said look-up table comprise polynomial coefficients of at least degree two for different segments of said non-linear function, said polynomial coefficients configured to provide at least one of a rectangular or triangular basis function for each segment of said non-linear function;
at least one processor, coupled to the memory, operative to:
obtain a point from said look-up table that is near a magnitude of said complex input value; and
generate a complex output value by evaluating said polynomial coefficients at said point to perform a Taylor Series expansion from said point.--, therefor In column 8, in Claim 2, delete "2. A digital pre-distortion (DPD) system, comprising:
a digital signal processor configured to evaluate a non-linear function for a complex input value, comprising:
a memory configured to store at least one look-up table with polynomial interpolation that represents said non-linear function, wherein entries in said look-up table comprise polynomial coefficients of at least degree two for different segments of said non-linear function;
at least one processor, coupled to the memory, operative to:
obtain a point from said look-tip table that is near a magnitude of said complex input value; and
generate a complex output value by evaluating said polynomial coefficients at said point to perform a Taylor Series expansion from said point,
wherein values in said look-up table are configured to be obtained using a direct optimization technique that obtains physical data for said non-linear function by applying a set of complex input samples x(n) to said non-linear function and measuring a complex output y(n) of said non-linear function and directly computes parameters $\Phi$ of a memory model for said non-linear function from said physical data, said memory model comprises one or more look-up tables having polynomial interpolation, and said parameters $\Phi$ produce a substantially minimum mean square error, said parameters $\Phi$ are provided for storage as entries in said one or more look-up tables." and insert
--2. A digital pre-distortion (DPD) system, comprising:
a digital signal processor configured to evaluate a non-linear function for a complex input value, comprising:
a memory configured to store at least one look-up table with polynomial interpolation that represents said non-linear function, wherein entries in said look-up table comprise polynomial coefficients of at least degree two for different segments of said non-linear function;
at least one processor, coupled to the memory, operative to:
obtain a point from said look-up table that is near a magnitude of said complex input value; and
generate a complex output value by evaluating said polynomial coefficients at said point to perform a Taylor Series expansion from said point,
wherein values in said look-up table are configured to be obtained using a direct optimization

CERTIFICATE OF CORRECTION (continued)
U.S. Pat. No. 9,225,501 B2 technique that obtains physical data for said non-linear function by applying a set of complex input samples x(n) to said non-linear function and measuring a complex output y(n) of said non-linear function and directly computes parameters $\Phi$ of a memory model for said non-linear function from said physical data, said memory model comprises one or more look-up tables having polynomial interpolation, and said parameters $\Phi$ produce a substantially minimum mean square error, said parameters $\Phi$ are provided for storage as entries in said one or more look-up tables.--, therefor In column 8, in Claim 3, delete "3. The method of claim 1, wherein said step of obtaining a point from said look-up table that is near said magnitude of said complex input value comprises obtaining two points that are near said magnitude of said complex input value and wherein said method further comprises the steps of evaluating said polynomial coefficients for said two points to perform a Taylor Series expansion from each point to form two intermediate values and linearly interpolating between said two intermediate values to generate said complex output value." and
insert --3. The DPD system of claim 1, wherein:
said processor is configured to obtain two points that are near said magnitude of said complex input value, and
said digital signal processor is further configured to:
evaluate said polynomial coefficients for said two points to perform a Taylor Series expansion from each point to form two intermediate values, and
linearly interpolate between said two intermediate values to generate said complex output value.--, therefor In column 8, in Claim 4, delete "4. The method of claim 1, wherein said non-linear function characterizes one or more of a power amplifier and an inverse of a power amplifier." and
insert --4. The DPD system of claim 1, wherein said non-linear function characterizes one or more of a power amplifier and an inverse of a power amplifier.--, therefor In column 8, in Claim 5, delete "5. The method of claim 1, wherein said one or more look-up tables are used to implement digital pre-distortion." and insert --5. The DPD system of claim 1, wherein said one or more look-up tables are configured to be used to implement digital pre-distortion.--, therefor In column 8, in Claim 6, delete "6. The method of claim 1, wherein said one or more look-up tables with polynomial interpolation are used in a processor instruction as part of an instruction set of one or more of a scalar processor and a vector processor." and insert --6. The DPD system of claim 1, wherein said one or more look-up tables with polynomial interpolation are configured to be used in a processor instruction as part of an instruction set of one or more of a scalar processor and a vector processor.--, therefor In column 8, in Claim 7, delete "7. The method of claim 6, wherein said look-up table is stored in a memory of said one or more of a scalar processor and a vector processor, and the polynomial interpolation is performed as part of a user-defined non-linear instruction that takes a complex number as an input, x, and computes f(x)." and insert --7. The DPD system of claim 6, wherein said look-up table is stored in a memory of said one or more of a scalar processor and a vector processor, and the polynomial interpolation is configured to be performed as part of a user-defined non-linear instruction that takes a complex number as an input, x, and computes f(x).--, therefor In column 8, in Claim 8, delete "8. The method of claim 7, wherein said vector processor applies a complex input vector [$x_1, x_2, \ldots, x_N$] to a plurality of non-linear functions $f_1, f_2, \ldots f_N$ to compute a complex vector output, $f_1(x_1), f_2(x_2) \ldots f_N(x_N)$." and insert --8. The DPD system of claim 7, wherein said vector processor is configured to apply a complex input vector [$x_1, x_2, \ldots, x_N$] to a plurality of non-linear functions $f_1, f_2, \ldots f_N$ to compute a complex vector output, $f_1(x_1), f_2(x_2) \ldots f_N(x_N)$.--, therefor In column 9, in Claim 9, delete "9. The method of claim 1, wherein values in said look-up tables are obtained using one or more of a least squares algorithm, recursive least squares (RLS) and least mean square (LMS)." and insert --9. The DPD system of claim 1, wherein values in said look-up tables are configured to be obtained using one or more of a least squares algorithm, recursive least squares (RLS) and least mean square (LMS).--, therefor In column 9, in Claim 10, delete "10. The method of claim 1, wherein said point that is near said magnitude of said complex input value comprises said point that is closest to said magnitude of said complex input value." and insert --10. The DPD system of claim 1, wherein said point that is near said magnitude of said complex input value comprises a point that is closest to said magnitude of said complex input value.--, therefor In column 9, in Claim 11, delete "11. A power amplifier, comprising:
a digital signal processor that evaluates a non-linear function for a complex input value, comprising:
a memory configured to store storing at least one look-up table with polynomial interpolation that represents said non-linear function, wherein entries in said look-up table comprise polynomial coefficients of at least degree two for different segments of said non-linear function, said polynomial coefficients configured to provide at least one of a rectangular or triangular basis function for each segment of said non-linear function; and
at least one processor, coupled to the memory, operative to:
obtain a point from said look-tip table that is near a magnitude of said complex input value; and
generate a complex output value by evaluating said polynomial coefficients at said point to perform a Taylor Series expansion from said point." and insert --11. A power amplifier, comprising:
a digital signal processor that evaluates a non-linear function for a complex input value, comprising:
a memory configured to store at least one look-up table with polynomial interpolation that represents said non-linear function, wherein entries in said look-up table comprise polynomial coefficients of at least degree two for different segments of said non-linear function, said polynomial coefficients configured to provide at least one of a rectangular or triangular basis function for each segment of said non-linear function; and
at least one processor, coupled to the memory, operative to:
obtain a point from said look-up table that is near a magnitude of said complex input value; and
generate a complex output value by evaluating said polynomial coefficients at said point to perform a Taylor Series expansion from said point.--, therefor In column 9-10, in Claim 12, delete "12. A power amplifier, comprising:
a digital signal processor that evaluates a non-linear function for a complex input value, comprising:
a memory configured to store at least one look-up table-with polynomial interpolation that represents

CERTIFICATE OF CORRECTION (continued)
U.S. Pat. No. 9,225,501 B2 said non-linear function, wherein entries in said look-up table comprise polynomial coefficients of at least degree two for different segments of said non-linear function; and
at least one processor, coupled to the memory, operative to:
obtain a point from said look-tip table that is near a magnitude of said complex input value; and
generate a complex output-value by evaluating said polynomial coefficients at said point to perform a Taylor Series expansion from said point,
wherein values in said look-up table are configured to be obtained using a direct optimization technique that obtains physical data for said non-linear function by applying a set of complex input samples x(n) to said non-linear function and measuring a complex output y(n) of said non-linear function and directly computes parameters Φ of a memory model for said non-linear function from said physical data, said memory model comprises one or more look-up tables having polynomial interpolation, and said parameters Φ produce a substantially minimum mean square error, said parameters Φ are provided for storage as entries in said one or more look-up tables." and insert
--12. A power amplifier, comprising:
a digital signal processor that evaluates a non-linear function for a complex input value, comprising:
a memory configured to store at least one look-up table with polynomial interpolation that represents said non-linear function, wherein entries in said look-up table comprise polynomial coefficients of at least degree two for different segments of said non-linear function; and
at least one processor, coupled to the memory, operative to:
obtain a point from said look-up table that is near a magnitude of said complex input value; and
generate a complex output value by evaluating said polynomial coefficients at said point to perform a Taylor Series expansion from said point,
wherein values in said look-up table are configured to be obtained using a direct optimization technique that obtains physical data for said non-linear function by applying a set of complex input samples x(n) to said non-linear function and measuring a complex output y(n) of said non-linear function and directly computes parameters Φ of a memory model for said non-linear function from said physical data, said memory model comprises one or more look-up tables having polynomial interpolation, and said parameters Φ produce a substantially minimum mean square error, said parameters Φ are provided for storage as entries in said one or more look-up tables.--, therefor In column 10, in Claim 13, delete "13. The digital signal processor of claim 11, wherein said step of obtaining a point from said look-up table that is near said magnitude of said complex input value comprises obtaining two points that are near said magnitude of said complex input value and wherein said digital signal processor further comprises the steps of evaluating said polynomial coefficients for said two points to perform a Taylor Series expansion from each point to form two intermediate values and linearly interpolating between said two intermediate values to generate said complex output value." and insert --13. The power amplifier of claim 11, wherein:
said processor is configured to obtain two points that are near said magnitude of said complex input value, and
said digital signal processor is further configured to:
evaluate said polynomial coefficients for said two points to perform a Taylor Series expansion from each point to form two intermediate values, and
linearly interpolate between said two intermediate values to generate said complex output value.--, therefor

CERTIFICATE OF CORRECTION (continued)
U.S. Pat. No. 9,225,501 B2

In column 10, in Claim 14, delete "14. The digital signal processor of claim 11, wherein said non-linear function characterizes one or more of a power amplifier and an inverse of a power amplifier" and insert --14. The power amplifier of claim 11, wherein said non-linear function characterizes one or more of a power amplification and an inverse of power amplification of the power amplifier.--, therefor In column 10, in Claim 15, delete "15. The digital signal processor of claim 11, wherein said one or more look-up tables are used to implement digital pre-distortion ." and insert --15. The power amplifier of claim 11, wherein said one or more look-up tables are configured to be used to implement digital pre-distortion.--, therefor In column 10, in Claim 16, delete "16. The digital signal processor of claim 11, wherein said one or more look-up tables with polynomial interpolation are used in a processor instruction as part of an instruction set of one or more of a scalar processor and a vector processor." and insert --16. The power amplifier of claim 11, wherein said one or more look-up tables with polynomial interpolation are configured to be used in a processor instruction as part of an instruction set of one or more of a scalar processor and a vector processor.--, therefor In column 10, in Claim 17, delete "17. The digital signal processor of claim 11, wherein said digital signal processor is one or more of a scalar processor and a vector processor, and wherein the polynomial interpolation is performed as part of a user-defined non-linear instruction that takes a complex number as an input, x, and computes f(x)." and insert --17. The power amplifier of claim 11, wherein said digital signal processor is one or more of a scalar processor and a vector processor, and wherein the polynomial interpolation is configured to be performed as part of a user-defined non-linear instruction that takes a complex number as an input, x, and computes f(x).--, therefor In column 10, in Claim 18, delete "18. The digital signal processor of claim 17, wherein said vector processor applies a complex input vector [$x_1, x_2, \ldots, x_N$] to a plurality of non-linear functions $f_1, f_2, \ldots f_N$ to compute a complex vector output, $f_1(x_1), f_2(x_2) \ldots f_N(x_N)$." and insert --18. The digital signal processor power amplifier of claim 17, wherein said vector processor is configured to apply a complex input vector [$x_1, x_2, \ldots, x_N$] to a plurality of non-linear functions $f_1, f_2, \ldots f_N$ to compute a complex vector output, $f_1(x_1), f_2(x_2) \ldots f_N(x_N)$.--, therefor In column 10, in Claim 19, delete "19. The digital signal processor of claim 11, wherein values in said look-up tables are obtained using one or more of a least squares algorithm, recursive least squares (RLS) and least mean square (LMS)." and insert --19. The power amplifier of claim 11, wherein values in said look-up tables are configured to be obtained using one or more of a least squares algorithm, recursive least squares (RLS) and least mean square (LMS).--, therefor In column 10, in Claim 20, delete "20. The digital signal processor of claim 11, wherein said point that is near said magnitude of said complex input value comprises said point that is closest to said magnitude of said complex input value." and insert --20. The power amplifier of claim 11, wherein said point that is near said magnitude of said complex input value comprises a point that is closest to said magnitude of said complex input value.--, therefor